United States Patent [19]

Grassl et al.

[11] Patent Number: 4,760,360
[45] Date of Patent: Jul. 26, 1988

[54] SURFACE-WAVE RESONATOR STRUCTURE HAVING METALLIZATION STRIPS INTERRUPTED IN SUB-SECTIONS IN REFLECTOR FINGERS

[75] Inventors: Hans P. Grassl, Zorneding; Peter Zibis, Munich, both of Fed. Rep. of Germany

[73] Assignee: Siemens Aktiengesellschaft, Berlin and Munich, Fed. Rep. of Germany

[21] Appl. No.: 84,088

[22] Filed: Aug. 11, 1987

[30] Foreign Application Priority Data

Aug. 29, 1986 [DE] Fed. Rep. of Germany ....... 3629464

[51] Int. Cl.[4] .......................... H03H 9/25; H03H 9/64
[52] U.S. Cl. ............................... 333/195; 310/313 D; 333/193; 333/196
[58] Field of Search .................. 333/150–154, 333/193–196; 310/313 R, 313 A, 313 B, 313 C, 313 D

[56] References Cited

U.S. PATENT DOCUMENTS 4,340,834  7/1982  Sato .................................... 333/195

Primary Examiner—Marvin L. Nussbaum
Attorney, Agent, or Firm—Hill, Van Santen, Steadman & Simpson

[57] ABSTRACT

A surface-wave resonator filter having at least two reflector structures and at least one interdigital transducer. At least a portion of one of the reflector structures has interruptions in the metallization strips thereof to define subsections of the metallization strip. Connecting metallizations are provided parallel to the wave propagation direction x between neighboring sub-sections of neighboring sub-divided metallization strips to electrically connect the neighboring sub-sections such that no two sub-sections of the same sub-divided metallization strip are electrically connected.

47 Claims, 1 Drawing Sheet

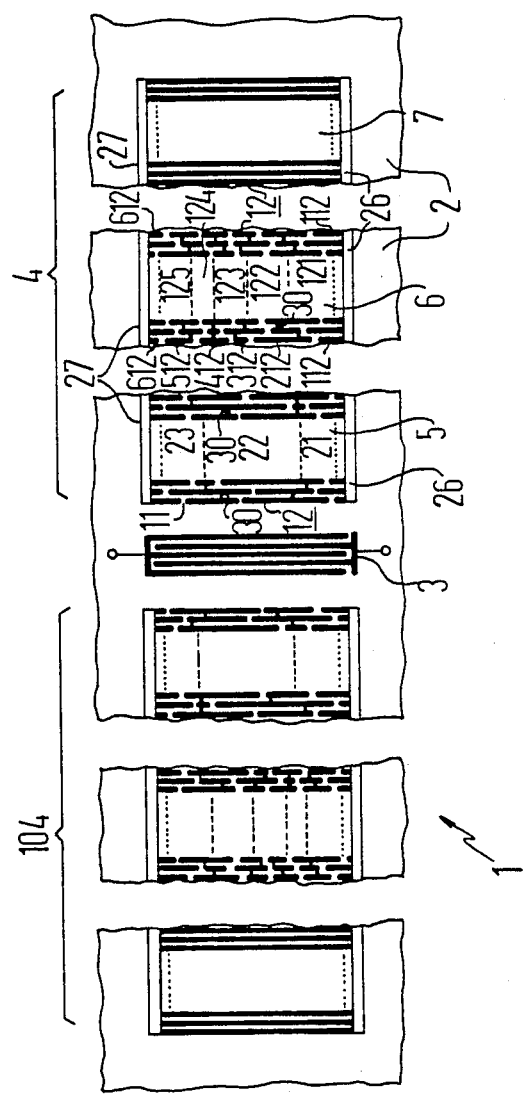

SURFACE-WAVE RESONATOR STRUCTURE HAVING METALLIZATION STRIPS INTERRUPTED IN SUB-SECTIONS IN REFLECTOR FINGERS

BACKGROUND OF THE INVENTION

The invention relates in general to surface-wave resonator filters and, in particular, to a surface-wave resonator filter on a piezoelectric substrate with a reflector structure having metallization strips. At least one interdigital transducer is provided on the substrate and wave propagation occurs in a direction perpendicular to the metallization strips.

U.S. Pat. No. 4,623,855 assigned to the present assignee is incorporated herein by reference. Also incorporated herein by reference is the prior art discussed in the background of U.S. Pat. No. 4,623,855, specifically, the article entitled "IEEE Transactions on Sonics and Ultrasonics", Volume SU-25, No. 3 (1978), pp. 138–146 and U.S. Pat. No. 4,340,834.

From "IEEE Transactions on Sonics and Ultrasonics", Volume SU-25, No. 3 (1978), pages 138–146, a surface acoustic wave resonator filter is known whose reflector structure, as shown in FIG. 1 therein, has, instead of continuous metallization strips, a field of metallization points in a regular waffle-iron distribution. The metallization spots succeeding thereafter in the direction transversely to the wave propagation direction replace a respective metallization strip of conventional reflector structure. The individual metallization spots have dimension on the order of magnitude of the wave length or fractions of the wave lengths of that particular wave for which the respective reflector structure is intended. Given a strip length of e.g. 100 wave lengths, then for each individual strip, 200 interruptions result. FIG. 4 of this publication shows the result; namely, that secondary lobes of the frequency curve of a filter designed in this manner are still only poorly pronounced. This is attributed to the fact that in the direction of the individual metallization strips, no electric current flow can develop which leads to transverse modes based thereon and has as a consequence signifcant changes in the transit or propagation time speed of the desired propagating longitudinal wave.

An extremely frequent interruption of the customarily employed metallization strips, demanded in accordance with the above-cited publication, signifies an additional high technological design expense for the manufacture of such a filter.

It has already been investigated (U.S. Pat. No. 4,340,834) to what extent the result is made poorer if only four interruptions each given a number of fingers of the reflector structure are provided. These interruptions, in the case of all fingers provided for this purpose, have been localized so as to mutually correspond; i.e. all interruptions lie adjacent in one row. In this regard, see FIG. 1 and 4a of the U.S. Pat. This principle of corresponding subdivisions which are precisely adjacent one another, is also present in the case of all further examples of this U.S. Pat.

In contrast with arrangements of the above-discussed publications "IEEE Transactions . . . ", in the case of the arrangements of the U.S. Pat. No. 4,340,834, the occurrence of transverse modes has again been consciously taken into account. Due to the interruptions, on account of the regularity of their arrangement directed parallel to the wave propagation of the longitudinal wave, adjacent strips with propagation speeds different from one another develop therein (see U.S. Pat. No. 4,340,834, column 5). With the occurrence of these strips, the harmful effects of the occurring transverse modes are decreased therein. However, an additional attenuation for the desired wave occurs.

According to FIG. 4B of the U.S. Pat. No. 4,340,834 the result attained therein is such that, in the curve of the attenuation progression, no side lobes of the transverse modes can be recognized any longer. On account of the logarithmic scale of the attenuation curve, however, only very considerable side lobes would be recognizable therein. However, the progression of the envelope or group delay is decisive, which, as a linear function, permits the relevance of still present side lobes to be significantly more clearly recognized, and, in the last analysis, it is this envelope delay which is of decisive significance for the signal transmission with a filter of this type.

A reflector structure designed for another purpose, namely for finger weighting, is shown in FIG. 1 in "Electronic Letters", Volume 16 (9/10/1980), pp. 793–794, incorporated herein by reference. It is provided therein, for a portion of the reflector structure, instead of providing reflector elements which are continuous over the entire width of the structure, to omit the weighting corresponding to the length components of this element provided for the respective reflector element. These omissions are distributed over the entire length of the respective reflector element so that a single weighted reflector element viewed in the direction of the individual reflector element, i.e. transversely to the wave propagation of the surface acoustic wave, consists of the reflector element pieces between which (in their transverse direction) considerable distances exist. The reflector element pieces all have an equally great length and there above-mentioned distances (in a transverse direction) from one another, correspond to the prescribed weighting of the individual reflector element, are more or less large. In the case of this known reflector structure, the individual strip-shaped reflector elements and also the reflector element pieces are grooves etched into the surface of the substrate, i.e. no metallization of the surface is present in this regard. Therefore, electric currents occurring as in the case of an arrangement according to the initially described publications transversely to the wave propagation direction (i.e. such currents which lead to transverse modes) are impossible in this embodiment with grooves. Thus, the weighted reflector elements consisting in the case of this arrangement of groove-shaped reflector element pieces exhibit several interruptions but have equal-length reflector element pieces, respectively.

SUMMARY OF THE INVENTION

It has been found that a surface-wave resonator filter of the type disclosed in U.S. Pat. No. 4,623,855 can be further optimized with respect to its electrical filter properties. The object of this optimization is achieved by a surface-wave resonator filter constructed according to the present invention.

The present invention is based on the recognition that the improvements achieved with the surface-wave resonator filter of U.S. Pat. No. 4,623,855 are accompanied by a certain degree of reduced reflectivity of the appertaining reflector structure. It has been found that a further improvement can be achieved in that sub-sections of metallization strips of the appertaining reflector structure which have floating potential, that is, which do not comprise any electrical connection in the known filter, can be defined with respect to their electrical potential with reference to neighboring sub-sections of neighboring metallization strips.

In accordance with the present invention, connecting metallizations are provided which electrically connect two neighboring sub-sections of two corresponding neighboring metallization strips to one another. The sub-sections of the same metallization strip are electrically separated from one another by the interruptions provided in accordance with U.S. Pat. No. 4,623,855. In particular, these connecting metallizations are provided only between two sub-sections of two neighboring metallization strips of which none are additionally connected to a further sub-section of the respective other metallization strip. That is, the connecting metallizations are to be arranged in a distribution such that an electrical connection between two sub-sections of an individual metallization strip does not occur via the two metallization connections between sub-sections of two neighboring metallization strips.

BRIEF DESCRIPTION OF THE DRAWING

The features of the present invention which are believed to be novel are set forth with particularity in the appended claims. The invention, together with further objects and advantages, may best be understood by reference to the following description taken in conjunction with the accompanying drawing and in which:

The FIGURE is a partial depiction of a surfave-wave resonator filter constructed according to the present invention.

DESCRIPTION OF THE PREFERRED EMBODIMENT

The present invention is embodied in a surface-wave resonator filter of the type shown in the FIGURE which has at least two reflector structures and an interdigital transducer. The present invention provides that the reflector structure has interruptions and connecting metallizations for its metallization strips. However, it is to be appreciated that not all portions of the overall reflector structure need have these interruptions and connecting metallizations. It is adequate when only one portion (as seen in the direction parallel to wave propagation) of the reflector structure is provided with interruptions and connecting metallizations. A respectively identical plurality of interruptions for each and every metallization strip (provided with interruptions) is preferably provided for the reflector structure or for such a portion thereof. It is also advantageous to fashion a plurality of portions (following one another in the wave propagation direction) of the reflector structure according to the present invention and to provide a plurality of interruptions of the individual metallization strips for a respective portion (this plurality being constant within the respective portion) which differs from the plurality of interruptions of a respective metallization strip of another portion. The preferred number of interruptions is between two and five. For example, one portion of the reflector structure can have two interruptions for its metallization strips and another portion can have five interruptions. Analogously, one portion of the reflector structure can comprise absolutely no interruptions, whereby such a portion is particularly placed at that respective end of a reflector structure where the reflective influence is greatly diminished.

In a resonator filter of the present invention, the length of the interruptions is preferably dimensioned to be roughly of the size of the metallization strips or finger widths. The interruptions are also preferably randomly distributed. A width (measured transversely relative to the wave propagation direction) of the metallization connections is preferably substantially the same as the width of the metallization strips.

It is further recommended in a resonant filter constructed according to the present invention to connect the respective end-residing sub-sections of a respective metallization strip in the fashion of a bus bar, that is, such a reflector structure comprises bus bars having a known embodiment. It is advantageously provided that the plurality m of interruptions of a respective metallization strip (of a reflector portion) be distributed over the length of the respective metallization strip such that the first interruption of all metallization strips (of this portion) are situated in a first zone, all second interruptions of all metallization strips are situated in a second zone, etc. These zones extend strip-like parallel to the wave propagation direction and are arranged side-by-side parallel to this propagation direction. These zones, that is, either 2, 3, 4 or 5 zones, lying side-by-side which are provided in a portion of the reflector structure comprising respectively, 2, 3, 4 or 5 interruptions for each and every metallization strip can have equidistant width. The positional distribution of the interruptions relative to one another in respective zones is disclosed in U.S. Pat. No. 4,623,855. For example, the interruptions may be randomly distributed in each and every individual zone. However, some other distribution, for example a sinusoidal distribution within a respective zone can also be provided. Such an envisioned division of a respective portion or, respectively, of the entire reflector structure into individual zones facilitates the production of the design for this resonator structure having connecting metallization. This division into zones guarantees that every sub-section of each and every metallization strip can be connected to a sub-section of a neighboring metallization strip without electrical connections of sub-sections of metallization strips to one another having to be thereby provided in order to avoid floating sub-sections.

As shown in the FIGURE, a surface-wave resonator filter 1 has a piezoelectric substrate 2 which may be composed of, for example, lithiumniobat. At least two reflector structures 4, 104 are arranged in a direction of wave propagation x with reference to an input/output interdigital transducer 3. The two reflector structures 4, 104 and the interdigital transducer 3 have metallization strips.

As shown in the FIGURE, the metallization strips 12 of the reflector structure 4 in portions 5 and 6, have multiple interruptions 11 of the metallization strips 12 in a transverse direction y relative to the wave propagation direction x.

Referring now to the portion 5 of the reflector structure 4, the interruptions 11 are distributed relative to one another in the direction y of the metallization strips 12 to define subsections (such as 112 through 612 in portion 6) of the metallization strips 12 thereby defining a sub-divided metallization strip 12.

The portion 5 has the same plurality of interruptions 11 for each of the metallization strips 12 at least in a region of the portion 5 of the reflector structure 4 in the wave propagation direction x. The portion 5 is divided into plurality of zones 21, 22, 23 parallel to the wave propagation x. The number of zones in the portion 5 is equal to the number of the plurality of interruptions 11. Only one interruption of the sub-divided metallization strip 12 is present in each of the zones. The interruptions 11 within a respective zone are arranged in a distribution relative to one another.

Connecting metallizations 30 are parallel to the wave propagation direction x and are provided between neighboring sub-sections of neighboring sub-divided metallization strips to electrically connect the neighboring sub-sections such that no two sub-sections of the sub-divided metallization strip are electrically connected.

The surface-wave resonator filter 1 may have a reflector structure 4 which has a plurality of portions, such as 5 and 6, having interruptions 11 of the sub-divided metallization strips 12 with connecting metallizations 30 between sub-sections of the sub-divided metallization strips 12. As shown in the FIGURE at least some of the portions, such as portions 5 and 6, have mutually differing pluralities of interruptions 11 in the sub-divided metallization strips 12. More specifically, the portion 5 has three interruptions 11 for each of the metallization strips 12 and three zones 21, 22 and 23, whereas the portion 6 has five interruptions 11 in the metallization strips 12 and five zones 121 through 125. Preferably, the number of interruptions 11 within a sub-divided metallization strip 12 is at least two and not greater than five. The distribution of the interruptions 11 within a zone may be random. The width of the connecting metallizations is preferably substantially equal to the width of the sub-divided metallization strips.

The reflector structure 4 may also have a portion 7 without interruptions in the metallization strips thereof. Also, the connecting metallizations of the end residing sub-sections of the sub-divided metallization strips are fashioned as bus bars 26 and 27, as shown in the FIGURE.

The invention is not limited to the particular details of the apparatus depicted, other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A surface-wave resonator filter comprising:
   at least two reflector structures composed of metallization strips on a substrate of piezoelectric material;
   at least one interdigital transducer on said substrate of piezoelectric material in which a wave propagation in a direction x perpendicular to said metallization strips exists, said metallization strips having multiple interruptions in a transverse direction y relative to said wave propagation x, whereby for at least one of said reflector structures for at least a portion thereof, at least a plurality of said metallization strips are provided with said interruptions distributed relative to one another in said direction y of said metallization strips, thereby dividing these metallization strips into sub-sections;
   said reflector structure having the same plurality of interruptions of said metallization strips at least in a region of a portion of said reflector structure in a direction of said wave propagation direction x;
   said portion divided into a plurality of zones parallel to said wave propagation direction x which is equal in number to the plurality of interruptions and respectively only one interruption of a respectively sub-divided metallization strip present in the region of each and every one of these zones, said interruptions arranged distributed relative to one another within a respective zone;
   connecting metallization proceeding in the direction of the wave propagation direction x provided between neighboring sub-sections of neighboring metallization strips, a respective sub-section of a metallization strip being electrically connected to a respectively neighboring sub-section of a neighboring metallization strip with these connecting metallizations, at least one sub-section other than end residing sub-sections of a metallization strip being electrically connected to a respectively neighboring sub-section other than end residing sub-sections of a neighboring metaiiization strip with one of said connecting metallizations, whereby no connecting metallizations are present which provide electrical connection between two sub-sections of one and the same metallization strip.

2. The surface-wave resonator filter described in claim 1, wherein said reflector structure comprises a plurality of portions having interruptions of said metallization strips and having connecting metallizations between said sub-sections thereof, said portions comprising mutually differing pluralities of interruptions of said metallization strips.

3. The surface-wave resonator filter described in claim 1, wherein said reflector structure also has a portion without interruptions.

4. The surface-wave resonator filter described in claim 1, wherein the number of interruptions is in the range of 2 to 5.

5. The surface-wave resonator filter described in claim 1, wherein the interruptions within a zone of the reflector structure are arranged in a random distribution.

6. The surface-wave resonator filter described in claim 1, wherein the connecting metallizations of respectively end-residing sub-sections are fashioned as bus bars.

7. The surface-wave resonator filter described in claim 1, wherein the interruptions of the metallization strips are dimensioned roughly of the size of the width of the metallization strips.

8. The surface-wave resonator filter described in claim 1, wherein the connecting metallizations are dimensioned with a width (transversely relative to the wave propagation direction (x)) of about the size of the width of the metallization strips.

9. The surface-wave resonator described in claim 1, wherein each sub-section other then end residing sub-sections of a metallization strip are electrically connected to a respectively neighboring sub-section other than end residing sub-sections of a neighboring metallization strip with said connecting metallizations.

10. A surface-wave resonator filter comprising:
    piezoelectric substrate;
    at least two reflector structures having metallization strips on said substrate;
    at least one interdigital transducer on said substrate and adjacent said reflector structures in which a wave propagation in a direction x perpendicular to said metallization strip exists;

said metallization strips of at least one of said reflector structures having multiple interruptions in a transverse direction y relative to said wave propagation direction x;

at least a portion of said one of said reflector structures having said interruptions distributed relative to one another in said direction y of said metallization strips to define sub-sections of said metallization strips thereby defining a sub-divided metallization strip;

said one of said reflector structures having the same plurality of interruptions for each of said metallization strips at least in a region of said portion of said one of said reflector structures in said wave propagation direction x;

said portion divided into a plurality of zones parallel to said wave propagation direction x which is equal in number to said plurality of interruptions, only one interruption of said sub-divided metallization strip present in each of said zones, said interruptions within a respective zone arranged in a distribution relative to one another; and connecting metallizations parallel to said wave propagation direction x provided between neighboring sub-sections of neighboring sub-divided metallization strips to electrically connect said neighboring sub-sections such that no two sub-sections of the same sub-divided metallization strip are electrically connected, at least one sub-section other than end residing sub-sections of a metallization strip being electrically connected to a respectively neighboring sub-section other than end residing sub-sections of a neighboring metallization strip with one of said connecting metallizations.

11. The surface-wave resonator filter described in claim 10, wherein said reflector structure comprises a plurality of portions having interruptions of said sub-divided metallization strips with connecting metallizations between sub-sections of said sub-divided metallization strips, at least some of said portions comprising mutually differing pluralities of interruptions in said sub-divided metallization strips.

12. The surface-wave resonator described in claim 10, wherein said reflector structure has a portion without interruption in metallization strips thereof.

13. The surface-wave resonator described in claim 10, wherein the number of interruptions in said sub-divided metallization strip is at least 2.

14. The surface-wave resonator described in claim 10, wherein the number of interruptions in said sub-divided metallization strip is not greater than 5.

15. The surface-wave resonator described in claim 10, wherein said distribution of said interruptions within a zone is random.

16. The surface-wave resonator described in claim 10, wherein said connecting metallization of end-residing sub-sections of said sub-divided metallization strips are fashioned as bus bars.

17. The surface-wave resonator described in claim 10, wherein the width of said connecting metallizations is substantially equal to the width of said sub-divided metallization strips.

18. The surface-wave resonator described in claim 10, wherein the length of said connecting metallizations is substantially equal to the width of said sub-divided metallization strips.

19. The surface-wave resonator described in claim 10, wherein each sub-section other than end residing sub-sections of a metallization strip are electricaily connected to a respectively neighboring sub-section other than end residing sub-sections of a neighboring metallization strip with said connecting metallizations.

20. A surface-wave resonator filter comprising:
at least two reflector structures composed of metallization strips on a substrate of piezoelectric material;

at least one interdigital transducer on said substrate of piezoelectric material in which a wave propagation in a direction x perpendicular to said metaliization strips exists, said metallization strips having multiple interruptions in a transverse direction y relative to said wave propagation x, whereby for at least one of said reflector structures for at least a portion thereof, at least a plurality of said metallization strips are provided with said interruptions distributed relative to one another in said direction y of said metaliization strips thereby dividing these metallization strips into sub-sections;

said reflector structure having the same plurality of interruptions of said metallization strips at least in a region of a portion of said reflector structure in a direction of said wave propagation direction x;

said portion divided into a plurality of zones parallel to said wave propagation direction x which is equal in number to the plurality of interruptions and respectively only one interruption of a respectively sub-divided metallization strip present in the region of each and every one of these zones, said interruptions arranged distributed relative to one another within a respective zone;

connecting metallization proceeding in the direction of sub-sections of neighboring metallization strips, a respective sub-section of a metallization strip being electrically connected to a respectively neighboring sub-section of a neighboring metallization strip with these connecting metallizations, whereby no connecting metallizations are present which provide electrical connection between two sub-sections of one and the same metallization strip;

said reflector structure further having a plurality of portions having interruptions of said metallization strips and having connecting metallizations between said sub-sections thereof, said portions having mutually differing pluralities of interruptions of metallization strips.

21. The surface-wave resonator filter described in claim 20, wherein said reflector structure also has a portion without interruptions.

22. The surface-wave resonator filter described in claim 20, wherein the number of interruptions is in the range of 2 to 5.

23. The surface-wave resonator filter described in claim 20, wherein the interruptions within a zone of the reflector structure are arranged in a random distribution.

24. The surface-wave resonator filter described in claim 20, wherein the connecting metallizations of respectively end-residing sub-sections are fashioned as bus bars.

25. The surface-wave resonator filter described in claim 20, wherein the interruptions of the metallization strips are dimensioned roughly of the size of the width of the metallization strips.

26. The surface-wave resonator filter described in claim 20, wherein the connecting metallizations are dimensioned with a width (transversely relative to the wave propagation direction (x)) of about the size of the width of the metallization strips.

27. A surface-wave resonator filter comprising:
piezoelectric substrate;
at least two reflector structures having metallization strips on said substrate;
at least one interdigital transducer on said substrate and adjacent said reflector structures in which a wave propagation in a direction x perpendicular to said metallization strip exists;
said metallization strips of at least one of said reflector structures having multiple interruptions in a transverse direction y relative to said wave propagation direction x;
at least a portion of said one of said reflector structures having said interruptions distributed relative to one another in said direction y of said metallization strips to define sub-sections of said metallization strips thereby defining a sub-divided metallization strip;
said one of reflector structures having the same plurality of interruptions for each of said metallization strips at least in a region of said portion of said one of said reflector structures in said wave propagation direction x;
said portion divided into a plurality of zones parallel to said wave propagation direction x which is equal in number to said plurality of interruptions, only one interruption of said sub-divided metallization strip present in each of said zones, said interruptions within a respective zone arranged in a distribution relative to one another; and
connecting metallizations parallel to said wave propagation direction x provided between neighboring sub-section of neighboring sub-divided metallization strips to electrically connect said neighboring sub-section such that no two sub-sections of the same sub-divided metallization strip are electrically connected;
said one of said reflector structure further having a plurality of portions having interruptions of said sub-divided metallization strips with connecting metallization between sub-sections sections of said sub-divided metallization strips, at least some of said portions having mutually differing pluralities of interruptions in said sub-divided metallization strips.

28. The surface-wave resonator described in claim 27, wherein said reflector structure has a portion without interruption in metallization strips thereof.

29. The surface-wave resonator described in claim 27, wherein the number of interruptions in said sub-divided metallization strip is at least 2.

30. The surface-wave resonator described in claim 27, wherein the number of interruptions in said sub-divided metallization strip is not greater than 5.

31. The surface-wave resonator described in claim 27, wherein said distribution of said interruptions within a zone is random.

32. The surface-wave resonator described in claim 27, wherein said connecting metallization of end-residing sub-sections of said sub-divided metallization strips are fashioned as bus bars.

33. The surface-wave resonator described in claim 27, wherein the width of said connecting metallizations is substantially equal to the width of said sub-divided metallization strips.

34. The surface-wave resonator described in claim 27, wherein the length of said connecting metallizations is substantially equal to the width of said sub-divided metallization strips.

35. A surface-wave resonator filter comprising:
at least two reflector structures composed of metallization strips on a substrate of piezoelectric material;
at least one interdigital transducer on said substrate of piezoelectric material in which a wave propagation in a direction x perpendicular to said metallization strips exists, said metallization strips having multiple interruptions in a transverse direction y relative to said wave propagation x, whereby for at least one of said reflector structures for at least a portion thereof, at least a plurality of said metallization strips are provided with said interruptions distributed relative to one another in said direction y of said metallization strips, thereby dividing these metallization strips into sub-sections;
said reflector structure having the same plurality of interruptions of said metallization strips at least in a region of a portion of said reflector structure in a direction of said wave propagation direction x;
said portion divided into a plurality of zones parallel to said wave propagation direction x which is equal in number to the plurality of interruptions and respectively only one interruption of a respectively sub-divided metallization strip present in the region of each and every one of these zones, said interruptions arranged in a random distribution relative to one another within a respective zone;
connecting metallization proceeding in the direction of the wave propagation direction x provided between neighboring sub-sections of neighboring metallization strips, a respective sub-section of a metallization strip being electrically connected to a respectively neighboring sub-section of a neighboring metallization strip with these connecting metallizations, whereby no connecting metallizations are present which provide electrical connection between two-sections of one and the same metallization strip;

36. The surface-wave resonator filter described in claim 35, wherein said reflector structure also has a portion without interruptions.

37. The surface-wave resonator filter described in claim 35, wherein the number of interruptions is in the range of 2 to 5.

38. The surface-wave resonator filter described in claim 35, wherein the connecting metallizations of respectively end-residing sub-sections are fashioned as bus bars.

39. The surface-wave resonator filter described in claim 35, wherein the interruptions of the metallization strips are dimensioned roughly of the size of the width of the metallization strips.

40. The surface-wave resonator filter described in claim 35, wherein the connecting metallizations are dimensioned with a width (transversely relative to the wave propagation direction (x)) of about the size of the width of the metallization strips.

41. A surface-wave resonator filter comprising:
piezoelectric substrate;
at least two reflector structures having metallization strips on said substrate;

at least one interdigital transducer on said substrate and adjacent said reflector structures in which a wave propagation in a direction x perpendicular to said metallization strip exists;

said metallization strips of at least one of said reflector structures having multiple interruptions in a transverse direction y relative to said wave propagation direction x;

at least a portion of said one of said reflector structures having said interruptions distributed relative to one another in said direction y of said metallization strips to define sub-sections of said metallization strips thereby defining a sub-divided metallization strip;

said one of reflector structures having the same plurality of interruptions for each of said metallization strips at least in a region of said portion of said one of said reflector structures in said wave propagation direction x;

said portion divided into a plurality of zones parallel to said wave propagation direction x which is equal in number to said plurality of interruptions, only one interruption of said sub-divided metallization strip present in each of said zones, said interruptions within a respective zone arranged in a random distribution relative to one another; and connecting metallizations parallel to said wave propagation direction x provided between neighboring sub-sections of neighboring sub-divided metallization strips to electrically connect said neighboring sub-sections such that no two sub-sections of the same sub-divided metallization strip are electrically connected.

42. The surface-wave resonator described in claim 41, wherein said reflector structure has a portion without interruption in metallization strips thereof.

43. The surface-wave resonator described in claim 41, wherein the number of interruptions in sub-divided metallization strip is at least 2.

44. The surface-wave resonator described in claim 41, wherein the number of interruptions in said sub-divided metallization strip is not greater than 5.

45. The surface-wave resonator described in claim 41, wherein said connecting metallization of end-residing sub-sections of said sub-divided metallization strips are fashioned as bus bars.

46. The surface-wave resonator described in claim 41, wherein the width of said connecting metallizations is substantially equal to the width of said sub-divided metallization strips.

47. The surface-wave resonator described in claim 41, wherein the length of said connecting metallization is substantially equal to the width of said sub-divided metallization strips.

* * * * *